United States Patent [19]

Zens

[11] Patent Number: 4,549,136
[45] Date of Patent: Oct. 22, 1985

[54] CONTROLLED SUSCEPTIBILITY PLUGS

[75] Inventor: Albert P. Zens, Fremont, Calif.

[73] Assignee: Varian Associates, Inc., Palo Alto, Calif.

[21] Appl. No.: 482,344

[22] Filed: Apr. 7, 1983

[51] Int. Cl.[4] .............................................. G01R 33/08
[52] U.S. Cl. .................................... 324/308; 324/321
[58] Field of Search ................ 324/300, 318, 321, 307

[56] References Cited

U.S. PATENT DOCUMENTS

| | | | |
|---|---|---|---|
| 3,593,117 | 7/1971 | Koch | 324/321 |
| 3,757,204 | 9/1973 | Hyde | 324/321 |
| 4,301,411 | 11/1981 | Wardell | 324/308 |
| 4,365,199 | 12/1982 | McNair | 324/321 |

OTHER PUBLICATIONS

Shoolery, NMR/EPR Spectroscopy Technical Information Bulletin, vol. III, No. 3, pp. 8-9.

Primary Examiner—Michael J. Tokar
Attorney, Agent, or Firm—Stanley Z. Cole; Edward H. Berkowitz

[57] ABSTRACT

It is desired to promote magnetic homogeneity of materials, including structural elements, present in the sensitive volume of a gyromagnetic analysis apparatus. Where the sample is rotated along an axis transverse to the field the requirement reduces to establishing axial homogeneity. Plugs which match the solvent magnetic susceptibility are employed to constrain a sample within the central region of an RF probe coil thereby appearing relatively invisible in the magnetic sense to the instrument. The susceptibility of materials can be tailored to achieve a desired value to suppress magnetic perturbation without introducing extraneous signals.

6 Claims, 5 Drawing Figures

4,549,136

CONTROLLED SUSCEPTIBILITY PLUGS

FIELD OF THE INVENTION

The present invention relates generally to analytic instrumentation based upon magnetic resonance and in particular to sample containment and presentation for such instrumentation.

BACKGROUND OF THE INVENTION

In the typical nuclear magnetic resonance (NMR) analysis instrument, a sample is placed within a volume situated within a homogeneous region of magnetic field. Excitation and detection of resonance is obtained from a suitably placed coil (or coils) ordinarily closely spaced with respect to the sample and preferably enveloping it. Quite typically for modern FI resonance spectroscopy, the sample is contained within a cylindrical tube coaxial with, and within a single coil and means are provided to rapidly rotate the sample tube about its axis to average any residual inhomogeneities of the magnetic field.

The material environment of the sample volume of typical prior art apparatus may contain a number of substances: the sample container, usually glass anid possibly including a stopper delimiter of nylon or similar inert material; a conductive material forming the RF coil conductor, commonly copper, aluminum, silver or gold; a coil form supporting the coil; a bonding agent for securing the conductor to the coil form; one or more holes in the coil form for necessary innerconnection of coil winding components; and, air permeating all available spaces. These materials, distinct from the sample and solvent itself, exhibit various magnetic susceptibilities and contribute influence to the signal. The relative rotation of the sample and the RF field acts to average sources of magnetic perturbations exhibiting non-cylindrical symmetry. The perturbation is effectively smeared over in imaginary cylindrically symmetric volume as a consequence of the rotation.

Some sources of magnetic perturbation have been considered in prior art compensatory schemes. Coil materials and the bonding agent materials have been considered by Anderson, et al., U.S. Pat. No. 3,091,732 where it was sought to provide coil materials and bonding agents for securing the coil to a coil form, which materials were required to exhibit a magnetic susceptibility approximating air (in which these components are necessarily submerged). The inhomogeneity due to the holes in the coil form is treated in copending U.S. Ser. No. 483,351, now U.S. Pat. No. 4,517,526 commonly assigned with the present invention.

The rapid rotation or spinning of the sample, while effective in averaging perturbations by rotation about an axis, cannot remove inhomogeneities in axial distribution of the sample. One such inhomogeneity has been observed in U.S. Pat. No. 4,077,002 to be concomitant with the spinning process itself in producing a curved miniscus due to the centripetal forces acting on a fluid sample. A simple expedient of the above patent took the form of a plug of polyfluorocarbon or like material inserted in the sample holder to float partially submerged in the sample and to constrain the sample more nearly to the desired volume. It is apparent, however, that the unspecified magnetic susceptibility of the polyfluorocarbon plug introduces a magnetic perturbation.

It has also been recognized that ordinary edge effects are to be avoided wherein the sample does not fill the sample volume and an empty portion of the volume thereby constitutes a region of distinct magnetic susceptibility. It is common practice to utilize very small bore tubes of length greater than the axial length of the sample volume, filled with sample well beyond the sensitive region. When availability of sample material is limited, however, this practice necessitates increased dilution and a consequent reduction in signal intensity.

Accordingly, it is an object of the present invention to enhance the sensivity of NMR analysis of samples by homogenizing the magnetic environment of the sample volume.

In one feature of the invention, the sensitive volume occupied by the sample is delimited by inert plugs which exhibit magnetic susceptibility substantially equal to that of the solvent in which the sample is presented for analysis and in particular that region of the sensitive volume which supports the best RF homogeneity is selected to contain the sample for RF irradiation.

In another feature of the invention, the inert plugs are so constituted to present a desired magnetic susceptibility tailored to be substantially equal to the solvent in which the sample is presented for analysis.

In still another feature of the invention, said inert plugs are so constituted to minimize that portion of signal intensity degenerate with the signal intensity characteristic of the sample.

In again another feature of the invention, the solvent is so constituted as to exhibit a characteristic volume magnetic susceptibility substantially equal to the inert plugs utilized to delimit the sample volume.

The principal nature and utility of this invention will become more apparent from the following detailed description when read in conjunction with the accompanying drawings.

Description of the Invention

Figure 1:
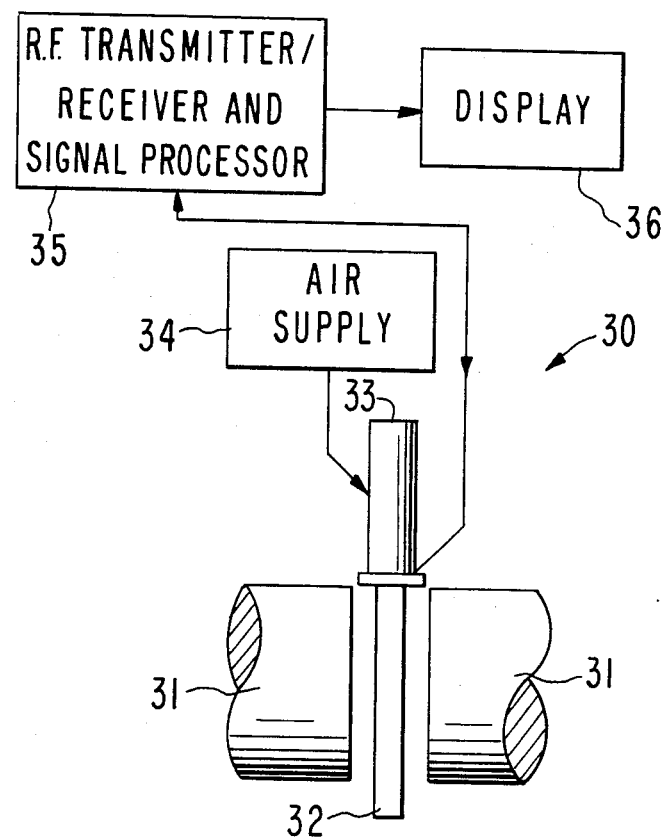
FIG. 1 is a schematic diagram of the context of the present invention.

Referring now to FIG. 1, an NMR spectrometer 30 is shown in a schematic block diagram form to include a high field magnet 31 with an air gap into which a probe 32 is located. Secured to the top of the probe is a spinner assembly 33 which receives a sample tube, not shown. Spinner assembly 33 supports the spinning of the sample tube in the magnetic field implemented from an air supply 34 connected to the spinner to provide rotation thereto. An RF transmitter/receiver and signal processor 35 is connected to the probe 32 which probe includes coils (not shown) for exciting and detecting resonance spectra of the sample in the sample tube. The signal processor also includes means for displaying the spectrum of the sample under examination as indicated symbolically by display means 36.

Figure 2:
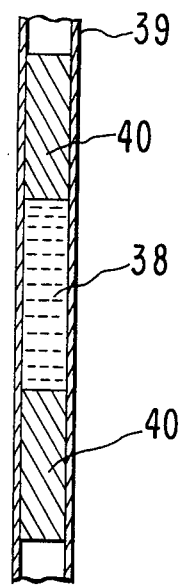
FIG. 2 illustrates an embodiment of the invention.

Turning now to FIG. 2, a preferred embodiment of the apparatus is indicated wherein a sample 38 is contained within a cylindrical tube 39 of small bore, as for example, 1-5 mm. Plugs 40 are machined from a material specially selected for the average magnetic susceptibility thereof as discussed below. The material of the plugs is selected to match the magnetic susceptibility of the solvent in which the sample is presented for analysis. Plugs 40 are in practice cylindrical and of such diameter to obtain a snug fit to the ID of the sample tube 39. Plugs are disposed at a separation which substantially defines the entire volume of sample and the now loaded sample tube is placed in the probe apparatus such that the sample volume is within the sensitive volume of the RF coil for analysis.

By way of example, a common solvent is $CDCl_3$. Using one selected magnetic analysis instrument a measured susceptibility for this solvent is $-0.7425 \times 10^{-6}$ (all magnetic susceptibility measurements quoted here are electromagnetic CGS units).

A commercially available polyimide, such as Dupont composition SP-1 was subject to analysis on the same instrument and found to exhibit a magnetic susceptibility of $-0.725 \times 10^{-6}$. Selection of this material for a delimiting plug therefore produces a very close match in susceptibility to the solvent $CHCl_3$.

Figure 3A:
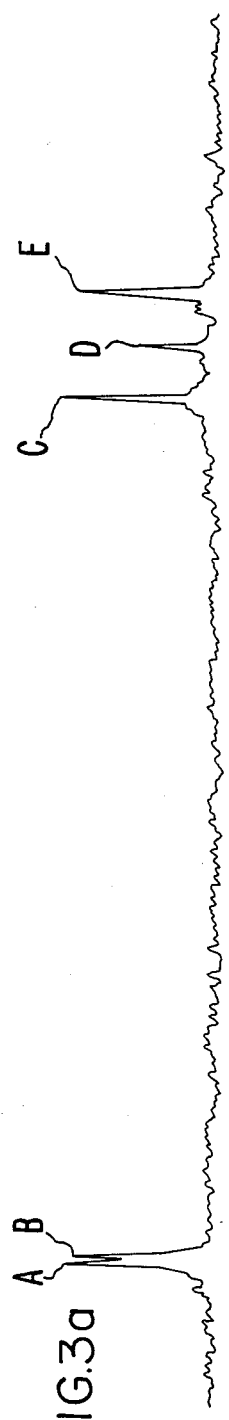
FIGS. 3a and 3b and 3c compare spectra of cholesteryl acetate in chloroform obtained in accord with conventional sample containment practice (a and b) and with the invention (c).

FIGS. 3a, b and c show a comparison of a portion of $C^{13}$ resonance spectra of cholesterol acetate in $CDCl_3$ contained in a sample tube of having a bore of 4.2 mm.

Figure 3B:
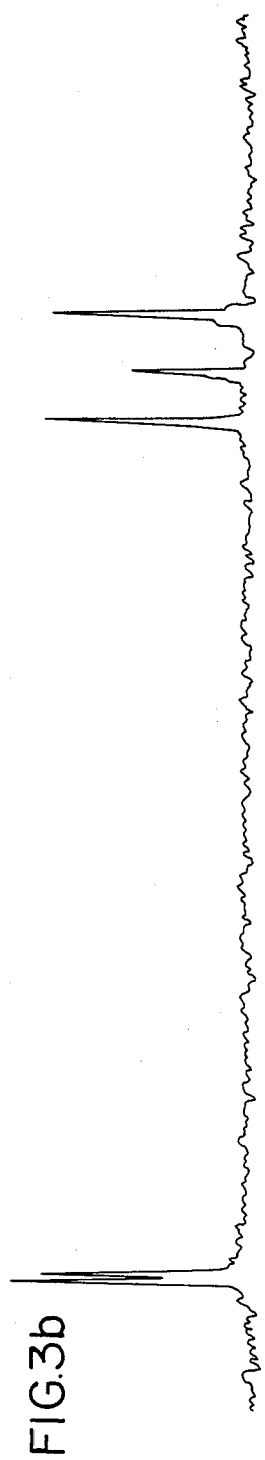
Figure 3C:
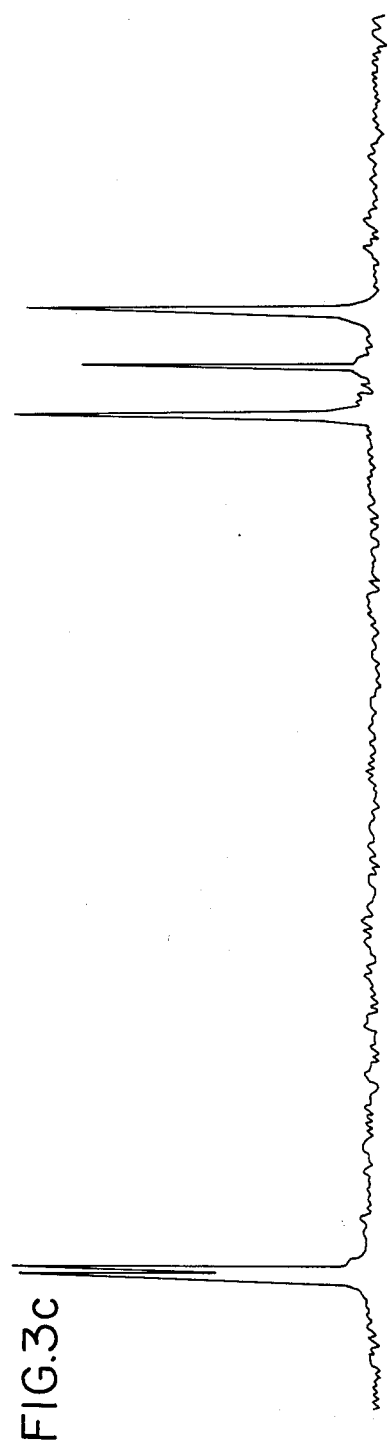

FIG. 3b shows the same sample spectra obtained with an arrangement wherein the material forming the plugs 40 were machined from plugs of a polyimide, specifically Vespel® SP-1, (Vespel® is a registered trademark of Dupont Company) of nominal diameter 4.2 mm 17 mm in length inserted to constrain the sample to a volume element of length which was symmetrically disposed within the RF coil of length 20 mm. The five peaks of these spectra correspond to an interval of the cholesterol acetate spectrum between 26 and 33 ppm with respect to tetramethylsilane. (These peaks correspond to carbons 7, 8, 25, 2 and 12 from left to right in standard analytical notation and denoted in FIGS. 3 a-c as peaks A, B, C, D, E.

A stock solution of 75% cholesterol acetate in 5 milliliters of $CDCl_3$ was prepared for the 3 spectra. For FIG. 3a, 250 microliters were placed in a tube simply positioned within the coil of the probe. For FIG. 3b the stock solution in the amount of 250 microliters was further diluted by $CDCl_3$ to distribute the sample over 33 milliliters over the axial length of the sample tube. The sample was positioned symmetrically with respect to the coil axial length of 22 mm. For FIG. 3, the glass tube containing 228 microliters of stock solution was confined between polyimide plugs, each of length about 17 mm. The plugs therefore occupy a portion of the sensitive volume within the coil.

The resolution is conveniently judged by the doublet representing peaks A and B and noted to be approximately the same for the spectra 3b and 3c (common vertical scale). The signal is quite significantly reduced in FIG. 3b due to the reduced concentration required to distribute the sample oiver the greater axial length. The spectrum of FIG. 3a is acquired using a standard vortex plug (of teflon) as described in U.S. Pat. No. 4,077,002, but no attention has been given to removal of magnetic inhomogeneities due to serious edge effects.

The close match between a natural or commercially avialable plug material and a chosen solvent is not a limitation to the present invention. It is within the scope of the invention to manipulate the constituents of an inert body to closely approach the volume magnetic susceptibility of the solvent in which the sample is presented for analysis. Linear combinations of constituent materials have been investigated for the purpose of synthesizing a desired volume susceptibility. In forming such a linear combination, other aspects of material properties must be considered such as chemical stability of the constituents. Of particular importance is the desire to displace from the material matrix, sources of signal which can degrade the signal of interest. Thus, in $C^{13}$ NMR analysis, it is particularly useful if a residual $C^{13}$ response arising from the delimiting plugs is reduced while also achieving the desired homogeneity of magnetic susceptibility over the volume of interest.

In the fabrication of sample delimiting plugs for $C^{13}$ NMR, $S_iO_2$ and $AlO_3$ are sometimes included as representative choices for carbon-free materials, chemically inert, which provide bulk or filler for the structural element while displacing possible competing signal ($C^{13}$) sources.

It is found in this work to be quite feasible to fabricate a composition which closely approximates a desired magnetic susceptibility. For example, acetone ($D_6$) is a well-known sample solvent for analytic NMR studies. The measured susceptibility for acetone ($D_6$) is $\chi = -0.460 \times 10^{-6}$. Starting from a commercially available resin (Shell EPON 828 of susceptibility $\chi = -0.782 \times 10^{-6}$) a mixture was formed in the ratio 1.42:1 with a previously prepared nearly zero susceptibility resin. As a matter of convenience a (near) zero susceptibility resin is separately prepared. An appropriate (near) zero susceptibility resin is described in U.S. Pat. No. 3,091,732. This step is not essential; one could as well directly produce the desired susceptibility. Addition of 1 milliliter of diethylene triamine (harder) yields a substance with measured susceptibility $\chi = -0.423 \times 10^{-6}$, approximating (within 8%) the acetone ($D_6$) susceptibility.

The adjustment of the magnetic susceptibility of structural members of the sensitive region of an NMR spectrometer to match a desired value is usually intended for obtaining homogeneity of the structure with the solvent in which the sample is presented for analysis. It is also within the scope of this invention to employ a composite solvent for which the effective magnetic susceptibility is alterable in predictable fashion to match a desired value. An example situation arises where a particular solvent may not be desirable for reasons of solubility or the like. The magnetic susceptibility of $CDCl_3$, as noted above is $-0.740 \times 10^{-6}$. A 53% solution of acetone ($D_6$) in 1,1,2,2-tetrabromethane ($\chi = -1.058 \times 10^{-6}$) exhibits a volumetric susceptibility closely matching $CDCl_3$. Using similar straightforward techniques weighted mixture of selected solvents may be used to match the composite solvent to structural members within the sensitive volume of the instrument.

It will be apparent that many changes could be made in the above apparatus and method and many apparently different embodiments of this invention could be made without departing from the scope thereof; it is therefore intended that all matter contained in the above descriptions and shown in the accompanying drawings shall be interpreted as illustrative and not in a limiting sense.

What is claimed is:

1. The method for improving the sensitivity of magnetic resonance analysis of a sample distributed in a solvent, comprising (a) selecting an inert material having substantially similar magnetic susceptibility to the magnetic susceptibility of said solvent, (b) constructing from said material at least two cylindrical bodies for insertion into a cylindrical sample tube one said body forming one end of an open container for holding said solvent and sample, (c) placing said sample in said sample tube above said first body and inserting another said body in said sample tube above and substantially contacting said sample to close said sample tube, (d) magnetically analyzing said sample in said closed sample tube.

2. A composite material for implementing mechanical structure within the sensitive volume of an NMR spectrometer, comprising a mixture of identifiable substances, each of said substances exhibiting diverse magnitude of respective volume magnetic susceptibility, said composite material exhibiting a desired effective volume magnetic susceptibility as a result of formation of said mixture, said effective volume magnetic susceptibility comprising a linear combination of magnetic susceptibilities of said identifiable substances, each said susceptibility of said substance weighted in the proportion born by the mass of said substance in relation to the mass of the composite material.

3. A composite for suspending sample material in a solvent for gyromagnetic analysis, said solvent comprising a mixture of identifiable substances, each of said substances exhibiting diverse magnitude of respective volume magnetic susceptibility, said composite solvent exhibiting a desired effective volume magnetic susceptibility as a result of formation of said mixture, said effective volume magnetic susceptibility comprising a linear combination of magnetic susceptibilities of said identifiable substances, each said susceptibility of said substance weighted in the proportion born by the volume of said substance in relation to the volume of the composite solvent.

4. The method for improving the sensitivity of magnetic resonance analysis of a sample distributed in a solvent, comprising (a) selecting an inert material of known magnetic susceptibility, (b) constructing from said material at least two cylindrical bodies for insertion into a cylindrical sample tube, one said body forming one end of an open container for holding said solvent and sample, (c) preparing a composite solvent having substantially similar net magnetic susceptibility to the known magnetic susceptibility of said inert material, and (d) combining said sample with said composite solvent for analysis.

5. The method of claim 4 wherein said step of preparing a composite solvent of desired magnetic susceptibility comprises forming a composite solvent of identifiable constituent substances, each said identifiable constituent substance exhibiting diverse magnitude of respective volume magnetic susceptibility, said composite solvent exhibiting a desired effective volume magnetic susceptibility as a result of formation of said composite, said effective volume magnetic susceptibility comprising a linear combination of magnetic susceptibilities of said identifiable solvents, each said susceptibility of said constituent substance weighted in the proportion borne by the mass of said constituent substance weighted in the proportion borne by the mass of the composite solvent.

6. The method of claim 5 comprising placing said sample solution in said sample tube above said first body and inserting another said body in said sample tube above and substantially contacting said sample to close said sample tube, and magnetically analyzing said sample in said closed sample tube.

* * * * *

UNITED STATES PATENT AND TRADEMARK OFFICE
CERTIFICATE OF CORRECTION

PATENT NO. : 4,549,136
DATED : 10/22/85
INVENTOR(S) : Albert P. Zens

It is certified that error appears in the above-identified patent and that said Letters Patent are hereby corrected as shown below:

Column 3 line 24    "3b" should read -- 3c --

Column 3 line 46    "3" should read -- 3c --

Signed and Sealed this

Thirteenth Day of May 1986

[SEAL]

Attest:

DONALD J. QUIGG

Attesting Officer    Commissioner of Patents and Trademarks